US005801410A

United States Patent [19]
Kim

[11] Patent Number: 5,801,410
[45] Date of Patent: Sep. 1, 1998

[54] FERROELECTRIC CAPACITORS INCLUDING EXTENDED ELECTRODES

[75] Inventor: Yun-Gi Kim, Kangweon-do, Rep. of Korea

[73] Assignee: Samsung Electronics Co., Ltd., Suwon, Rep. of Korea

[21] Appl. No.: 859,345

[22] Filed: May 20, 1997

[30]     Foreign Application Priority Data

Jun. 29, 1996 [KR] Rep. of Korea ............... 1996-26446

[51] Int. Cl.⁶ .................... H01L 29/78; H01L 29/44; H01L 29/52; H01L 29/92
[52] U.S. Cl. .................................. 257/295; 257/774
[58] Field of Search ........................... 257/295, 296, 257/300, 306, 311, 773, 774

[56]            References Cited

U.S. PATENT DOCUMENTS

| | | | |
|---|---|---|---|
| 4,910,708 | 3/1990 | Eaton, Jr. et al. | 365/145 |
| 5,122,477 | 6/1992 | Wolters et al. | 438/396 |
| 5,350,705 | 9/1994 | Brassington et al. | 257/295 |
| 5,369,296 | 11/1994 | Kato | 257/295 |
| 5,371,699 | 12/1994 | Larson | 365/145 |
| 5,432,732 | 7/1995 | Ohmi | 257/311 |
| 5,495,117 | 2/1996 | Larson | 257/295 |
| 5,536,672 | 7/1996 | Miller et al. | 438/631 |

FOREIGN PATENT DOCUMENTS 1-255262  10/1989  Japan ................. 257/296

*Primary Examiner*—Carl W. Whitehead
*Assistant Examiner*—Alice W. Tang
*Attorney, Agent, or Firm*—Myers Bigel Sibley & Sajovec

[57]           ABSTRACT

A ferroelectric capacitor includes a substrate and a capacitor electrode on the substrate. A ferroelectric layer is provided on the first capacitor electrode, and a first insulating layer on the ferroelectric layer has a first contact hole therein exposing a portion of the ferroelectric layer. A second capacitor electrode on the first insulating layer makes contact with the ferroelectric layer through the first contact hole. In addition, the second capacitor electrode includes an extension that extends across the first insulating layer away from the first contact hole. A second insulating layer on the second capacitor electrode opposite the substrate has a second contact hole therein exposing a portion of the second insulating capacitor electrode extension opposite the first insulating layer. A conductive line on the second insulating layer makes contact with the exposed portion of a second capacitor electrode extension opposite the insulating layer through the second contact hole.

14 Claims, 2 Drawing Sheets

FERROELECTRIC CAPACITORS INCLUDING EXTENDED ELECTRODES

FIELD OF THE INVENTION

The present invention relates to the field of microelectronics and more particularly to ferroelectric capacitors.

Background of the Invention

A ferroelectric random access memory (FRAM) device includes an array of ferroelectric memory cells. In particular, each memory cell includes a ferroelectric memory cell capacitor including a dielectric layer between two electrodes wherein the dielectric layer is formed from a ferroelectric material such as lead zirconate titanate. The ferroelectric characteristics of the dielectric layer, however, may deteriorate during subsequent processing. In particular, the ferroelectric dielectric layer may deteriorate as a result of reactions caused by thermal cycles. In addition, plasma damage may result during subsequent dry-etches and depositions.

A ferroelectric memory device according to the prior art is illustrated in FIG. 1. As shown, this ferroelectric memory device includes a first metal layer 19 making up a bit line and a butting contact, a gate region 3, an active region 25, and a contact opening 27 providing contact between the active region 25 and the first metal layer 19. This device also includes a lower electrode layer 9, buried contact openings 28 and 29, a second metal layer 23, a ferroelectric layer 11, and a contact opening 31 providing connection between the second metal layer 23 and the upper electrode layer 13.

The lower electrode layer 9 is connected to the active region 25 of a transistor on an active region of the substrate. As shown, the transistor can be formed adjacent the lower electrode layer 9. A contact opening 31 in the insulating layers 17 and 21 exposes an upper portion of the upper electrode layer 13 opposite the ferroelectric layer 11. When using a dry-etch to form the contact opening 31, however, plasma damage to the ferroelectric layer may result. The deposition and patterning of the second metal layer 23 and the second electrode layer 13 may also result in damage to the ferroelectric layer 11. In particular, the deposition of aluminum and dry-etching thereof during the formation of the upper electrode 13 and the second metal layer 23 may result in damage to the ferroelectric layer 11.

A cross-sectional view of the structure of FIG. 1 taken along section line 1–1' is illustrated in FIG. 2. As shown, a field oxide layer 1 is formed on a semiconductor substrate using a local oxidation (LOCOS) technique thus defining active and isolation regions of the substrate. The gate region 3 is formed on an active region of the substrate, and the interlayer insulating layer is deposited on the substrate, the gate region 3, and the field oxide layer 1. In addition, a barrier layer 7 can be formed on the interlayer insulating layer 5 using a deposition technique. A ferroelectric capacitor is then provided by forming a lower electrode layer 9, a ferroelectric (PZT) layer 11, and an upper electrode layer 13.

In particular, the electrode layers can be formed from platinum, and the ferroelectric layer can be formed from PZT. In addition, a barrier layer 15, such as a layer of titanium dioxide ($TiO_2$), can be deposited on the upper electrode layer 13 as shown in FIG. 2. Accordingly, the ferroelectric capacitor includes upper and lower electrodes 13 and 9, and a ferroelectric layer 11 therebetween.

The barrier layer 15 may reduce reactions between the insulating layers, and the ferroelectric layer during subsequent processing. As shown, an interlayer insulating layer 17 is deposited on the first interlayer insulating layer 5 and the ferroelectric capacitor including the upper and lower electrodes and the ferroelectric layer. The interlayer insulating layer 17 is then patterned, such as by etching, to thereby expose source/drain regions of the substrate and a first region of the lower electrode 9.

A first metal layer 19 is then formed on the interlayer insulating layer 17 filling the contact holes therein. The lower electrode layer 9 of the ferroelectric capacitor is thus connected to a first active region of a transistor on the substrate, and a second active region of the substrate is connected to the bit line after the first metal layer is patterned. Accordingly, the patterned metal layer provides a bit line and a butting contact for the memory device.

A third insulating layer 21 is then formed on the interlayer insulating layer 17 and the patterned metal layer 19. The third insulating layer 21 and the interlayer insulating layer 17 are then patterned, such as by dry-etching, to thereby form a contact opening 31 exposing a portion of the upper electrode layer 13 opposite the ferroelectric layer 11. A second metal layer 23 is formed on the third insulating layer 21 filling the contact hole 31, and this metal layer is patterned to provide an electrical contact between the upper electrode layer 13 and an external power supply terminal.

The ferroelectric layer 11, however, may deteriorate as a result of the plasma used to dry-etch the second metal layer 23. Furthermore, the characteristics of the ferroelectric capacitor may also be deteriorated due to reactions between the ferroelectric layer 11 and the interlayer insulating layer 17 during thermal treatments when forming the interlayer insulating layer 17 and the third insulating layer 21.

Accordingly, there continues to exist a need in the art for structures which can be used to protect the ferroelectric layer of a ferroelectric capacitor.

Summary of the Invention

It is therefore an object of the present invention to provide improved ferroelectric capacitors and memory devices.

It is another object of the present invention to provide ferroelectric capacitors having improved reliability.

It is still another object of the present invention to provide ferroelectric capacitors having improved ferroelectric characteristics.

These and other objects according to the present invention can be provided by ferroelectric capacitors including upper and lower capacitor electrodes and a ferroelectric layer therebetween wherein the upper capacitor electrode includes an extension extending away from the ferroelectric layer. An insulating layer can thus be formed on the upper electrode with a contact hole therein exposing a portion of the extension away from the ferroelectric layer, and a metal contact can be formed in the contact hole. Accordingly, damage to the ferroelectric layer during the formation of the contact hole and the metal contact can be reduced.

In particular, a ferroelectric capacitor according to the present invention can include a first capacitor electrode on a substrate and a ferroelectric layer on the first capacitor electrode. A first insulating layer is provided on the ferroelectric layer opposite the substrate wherein the first insulating layer has a first contact hole therein exposing a portion of the ferroelectric layer. A second capacitor electrode on the first insulating layer makes contact with the ferroelectric layer through the first contact hole. In addition, the second capacitor electrode includes an extension that extends across the first insulating layer away from the contact hole.

A second insulating layer on the second capacitor electrode has a second contact hole therein exposing a portion of the second capacitor electrode extension opposite the first insulating layer. A conductive line on the second insulating layer makes contact with the exposed portion of the second capacitor electrode extension opposite the insulating layer through the second contact hole. Accordingly, deterioration of the ferroelectric layer during formation of the second contact hole and the conductive line can be reduced. In particular, the placement of the second contact hole opposite the first insulating layer provides protection for the ferroelectric layer during the formation of the second contact hole and the conductive line.

In addition, the first insulating layer can include a barrier portion thereof on sidewalls of the ferroelectric layer and on a surface of the ferroelectric layer opposite the first capacitor electrode. More particularly, this barrier portion can be formed from titanium oxide. Accordingly, the barrier layer can further reduce reactions with the ferroelectric layer.

The ferroelectric layer can comprise lead zirconate titanate, and the first and second capacitor electrodes can each comprise platinum. Furthermore, the ferroelectric layer can have a first surface area, and the second capacitor electrode including the extension can have a second surface area greater than the first surface area.

According to an alternate aspect of the present invention, a ferroelectric memory device includes a gate electrode on an active region of a substrate, and a first insulating layer on the substrate and on the gate electrode wherein the first insulating layer has a contact hole therein exposing a portion of the active region adjacent the gate electrode. A first capacitor electrode is provided on the first insulating layer opposite the substrate, and a butting contact provides an electrical contact between a first portion of the first capacitor electrode and the exposed portion of the active region.

A ferroelectric layer is on a second portion of the first capacitor electrode, and a second insulating layer on the ferroelectric layer has a second contact hole therein exposing a portion of the ferroelectric layer. A second capacitor electrode on the second insulating layer makes contact with the ferroelectric layer through the second contact hole. In addition, the second capacitor electrode includes an extension extending across the second insulating layer away from the second contact hole. A third insulating layer on the second capacitor layer opposite the substrate has a third contact hole therein exposing a portion of the second capacitor electrode extension opposite the second insulating layer. A conductive line on the third insulating layer makes contact with the exposed portion of the second capacitor electrode extension opposite the second insulating layer through the third contact hole.

According to the capacitors and memory devices of the present invention, the ferroelectric characteristics of a ferroelectric layer can be improved. The reliability and characteristics of ferroelectric capacitors and memory devices including the structure of the present invention can thus be improved.

DETAILED DESCRIPTION

Figure 1:
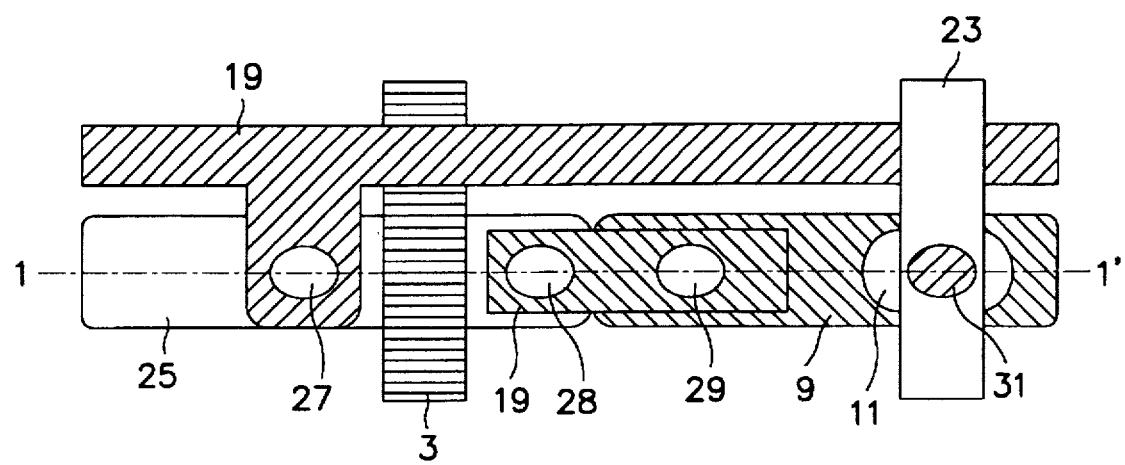
FIG. 1 is a plan view illustrating a ferroelectric memory device according to the prior art.
Figure 2:
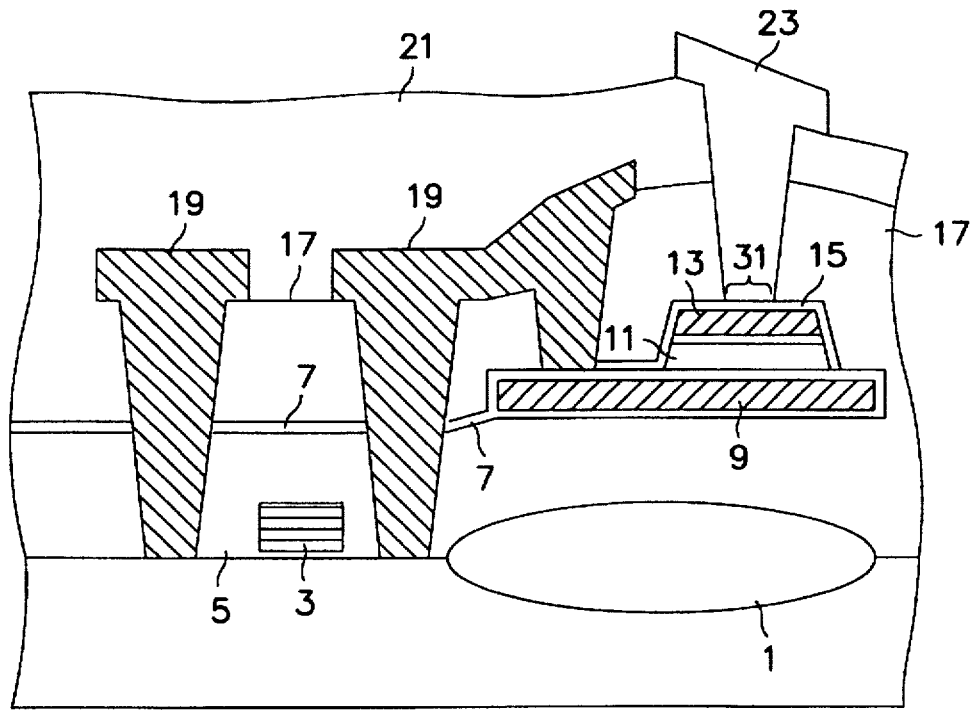
FIG. 2 is a cross sectional view taken along section line 1-1' of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 3:
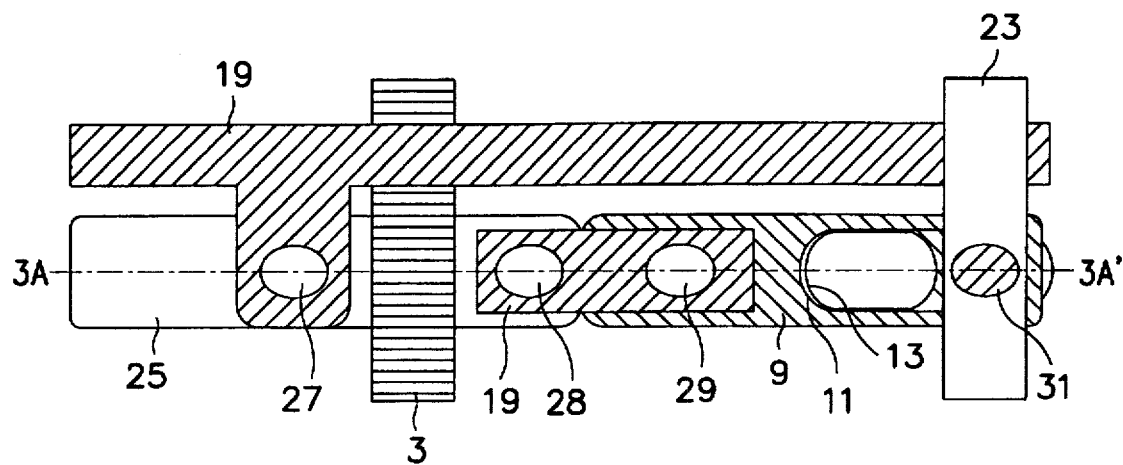
FIG. 3 is a plan view illustrating a ferroelectric memory device according to the present invention.
Figure 4:
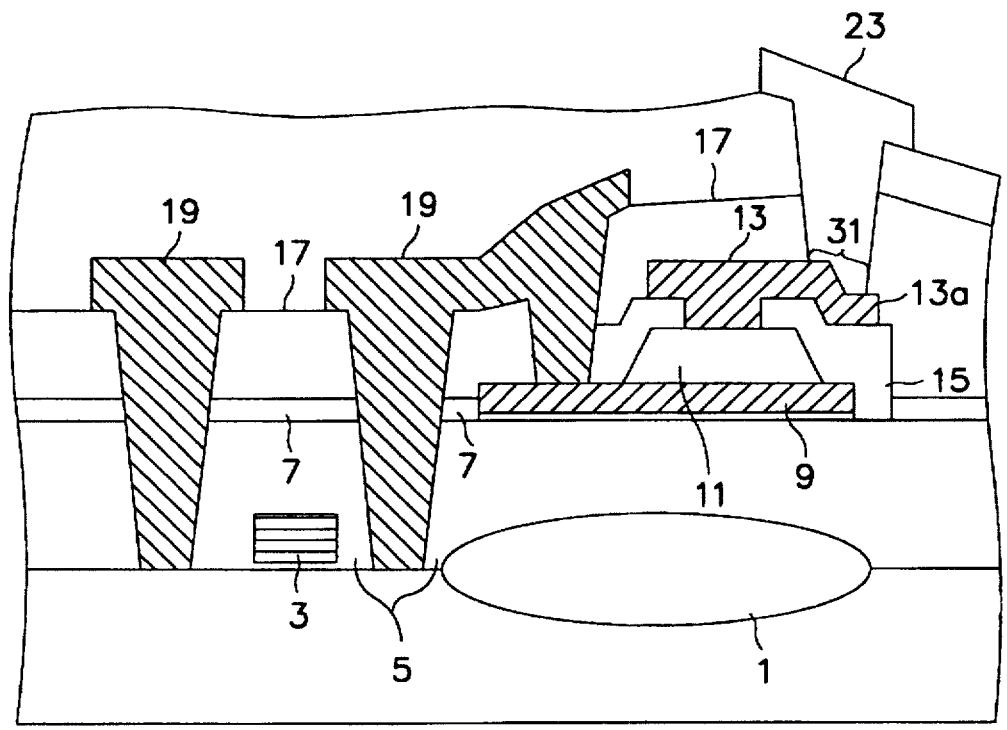
FIG. 4 is a cross sectional view taken along section line 3A—3A of FIG. 3.

FIG. 3 is a plan view of a ferroelectric memory device according to the present invention, and FIG. 4 is a cross-sectional view taken along Section Line 3A—3A of FIG. 3. As shown in FIGS. 3 and 4, this ferroelectric memory device includes a first patterned metal layer 19 providing a bit line and a butting contact, a gate region 3, an active region 25, and a contact opening 27 providing contact between the active region 25 and the portion of the first metal layer 19 making up the bit line. The memory device also includes a lower electrode layer 9, buried contact openings 28 and 29, a second metal layer 23, a ferroelectric layer 11, and a contact opening 31 providing contact between the second metal layer 23 and the upper electrode layer 13.

In particular, the upper electrode layer 13 includes an extension 13a thereof which extends away from the ferroelectric layer 11. Furthermore, the contact hole 31 exposes a portion of this extension opposite the barrier layer 15. Accordingly, damage to the ferroelectric layer 11 during the formation of the contact hole 31 and the second metal layer 23 can be reduced because the contact hole 31 is spaced from the ferroelectric layer 11.

As shown in FIG. 4, the ferroelectric capacitor is made up of the lower electrode 9, the ferroelectric layer 11, and the upper electrode 13. A portion of the upper electrode 13 is formed adjacent the ferroelectric layer 11, and an extension of the upper electrode extends across the barrier layer 15 opposite the ferroelectric layer 11. By forming the contact hole 31 to expose the extension of the upper electrode 13 opposite the barrier layer 15, reactions between the ferroelectric layer 11 and the interlayer insulating layer 5 can be reduced during subsequent processes such as annealing or depositing the interlayer insulating layer, or by forming the contact hole 31 and the second metal layer 23. Accordingly, the characteristics of a ferroelectric capacitor can be improved. In addition, plasma damage to the ferroelectric layer 11 caused by the plasma dry-etching during formation of the contact opening 31 can be reduced.

FIG. 4 is a cross-sectional view illustrating a ferroelectric memory cell taken along section line 3A—3A of FIG. 3. A shown, a field oxide layer 1 can be formed on the semiconductor substrate using a local oxidation (LOCOS) technique thus defining active and isolation regions of the substrate. A gate region 3 can be formed on the substrate, and an interlayer insulating layer 5 can be deposited on the field oxide layer, the substrate, and the gate region 3. In addition, a barrier layer 7 can be formed on the interlayer insulating layer using a deposition technique.

A ferroelectric capacitor is then formed on the interlayer insulating layer 5, wherein the ferroelectric capacitor includes a lower electrode 9, a ferroelectric layer 11, and an upper electrode layer 13. In particular, the electrode layers can be formed from platinum and the ferroelectric layer can be formed from PZT. Furthermore, the ferroelectric capacitor can include a barrier layer such as titanium dioxide (TiO₂) 15 adjacent the ferroelectric layer 11. In particular, the barrier layer 15 can be deposited on the ferroelectric layer 11, and a contact hole can be formed therein exposing a portion of the ferroelectric layer opposite the lower electrode 9. The upper electrode layer 13 can then be formed on the barrier layer 15 wherein the upper electrode layer 13 contacts the ferroelectric layer through the contact hole therein.

In particular, the upper electrode layer 13 includes an extension that extends across the barrier layer away from the contact hole therein, opposite the ferroelectric layer. A second interlayer insulating layer 17 is deposited on the barrier layer 7 and the ferroelectric capacitor. The second interlayer insulating layer 17 and the first interlayer insulating layer 5 are then patterned to provide contact openings exposing active regions of the substrate on opposite sides of the gate region 3 as well as a portion of the lower electrode 9 extending away from the ferroelectric layer 11. A first metal layer 19 is then formed on the second interlayer insulating layer 17 filling the contact holes therein. This first metal layer 19 is then patterned to form a bit line connected to one of the active regions of the substrate, and to form a butting contact connecting a second active region of the substrate with the lower electrode 9.

A third insulating layer 21 is then formed on the second interlayer insulating layer 17 and the patterned metal layer 19. The third insulating layer 21 is then patterned to provide a contact hole exposing the extension of the upper electrode layer 13. In particular, the contact hole 31 exposes a portion of the extension opposite the barrier layer 15. The contact hole can be formed by dry-etching the insulating layers 17 and 21, and a second metal layer 23 can be formed on the third insulating layer 21 filling the contact hole 31. This second metal layer can then be patterned to provide an electrical contact between the upper electrode 13 and an external power supply terminal.

As discussed above, the upper electrode layer 13 includes an extension across the barrier layer 15 opposite the ferroelectric layer 11. Accordingly, the contact opening 31 and the second metal layer 23 are provided on a portion of the upper electrode 13 remote from the ferroelectric layer 11.

Accordingly, the ferroelectric capacitor of the present invention includes an upper electrode layer 13 having a greater surface area than the ferroelectric layer 11. The electrical contact with the upper electrode layer may thus be made at a portion remote from the ferroelectric layer. Accordingly, deterioration of the ferroelectric layer due to plasma and annealing processes when forming the contact opening 31 and the second medal layer 23 can be reduced. The operating characteristics of the ferroelectric capacitor can thus be increased by reducing damage to the ferroelectric layer during processing. Stated in other words, the contact opening 31 exposes a portion of the upper electrode 13 remote from the ferroelectric layer 11. Accordingly, reactions with the ferroelectric layer 11 caused by annealing or plasma discharges when forming the third insulating layer 21, the contact hole 31, and the second metal layer 23 can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A ferroelectric capacitor comprising:

a substrate;

a first capacitor electrode on said substrate;

a ferroelectric layer on said first capacitor electrode;

a first insulating layer on said ferroelectric layer opposite said substrate wherein said first insulating layer has a first contact hole therein exposing a portion of said ferroelectric layer;

a second capacitor electrode on said first insulating layer, wherein said second capacitor electrode makes contact with said ferroelectric layer through said first contact hole, wherein said second capacitor electrode includes an extension thereof, and wherein said second capacitor electrode extension extends across said first insulating layer away from said first contact hole;

a second insulating layer on said second capacitor electrode opposite said substrate wherein said second insulating layer has a second contact hole therein exposing a portion of said second capacitor electrode extension opposite said first insulating layer; and a conductive line on said second insulating layer opposite said substrate, wherein said conductive line makes contact with said exposed portion of said second capacitor electrode extension opposite said insulating layer through said second contact hole.

2. A ferroelectric capacitor according to claim 1 wherein said first insulating layer comprises a barrier portion thereof on sidewalls of said ferroelectric layer and on a surface of said ferroelectric layer opposite said first capacitor electrode.

3. A ferroelectric capacitor according to claim 2 wherein said barrier portion comprises titanium oxide.

4. A ferroelectric capacitor according to claim 2 wherein said barrier layer reduces reactions with said ferroelectric layer.

5. A ferroelectric capacitor according to claim 1 wherein said ferroelectric layer comprises lead zirconate titanate.

6. A ferroelectric capacitor according to claim 1 wherein said first and second capacitor electrodes each comprise platinum.

7. A ferroelectric capacitor according to claim 1 wherein said ferroelectric layer has a first surface area and wherein said second capacitor electrode including said extension has a second surface area greater than said first surface area.

8. A ferroelectric memory device comprising:

a substrate having active and field regions thereof;

a gate electrode on said active region of said substrate;

a first insulating layer on said substrate and on said gate electrode wherein said first insulating layer has a contact hole therein exposing a portion of said active region adjacent said gate electrode;

a first capacitor electrode on said first insulating layer opposite said substrate;

a butting contact providing an electrical contact between a first portion of said first capacitor electrode and said exposed portion of said active region;

a ferroelectric layer on a second portion of said first capacitor electrode;

a second insulating layer on said ferroelectric layer opposite said substrate wherein said second insulating layer has a second contact hole therein exposing a portion of said ferroelectric layer;

a second capacitor electrode on said second insulating layer, wherein said second capacitor electrode makes contact with said ferroelectric layer through said second contact hole, wherein said second capacitor electrode includes an extension thereof, and wherein said second capacitor electrode extension extends across said second insulating layer away from said second contact hole;

a third insulating layer on said second capacitor electrode opposite said substrate wherein said third insulating layer has a third contact hole therein exposing a portion of said second capacitor electrode extension opposite said second insulating layer; and a conductive line on said third insulating layer opposite said substrate, wherein said conductive line makes contact with said exposed portion of said second capacitor electrode extension opposite said second insulating layer through said third contact hole.

9. A ferroelectric memory device according to claim 8 wherein said second insulating layer comprises a barrier portion thereof on sidewalls of said ferroelectric layer and on a surface of said ferroelectric layer opposite said first capacitor electrode.

10. A ferroelectric memory device according to claim 9 wherein said barrier portion comprises titanium oxide.

11. A ferroelectric memory device according to claim 9 wherein said barrier portion reduces reaction between said ferroelectric layer and said insulating layers.

12. A ferroelectric memory device according to claim 8 wherein said ferroelectric layer comprises lead zirconate titanate.

13. A ferroelectric memory device according to claim 8 wherein said first and second capacitor electrodes each comprise platinum.

14. A ferroelectric memory device according to claim 8 wherein said ferroelectric layer has a first surface area and wherein said second capacitor electrode including said extension has a second surface area greater than said first surface area.

* * * * *